(12) United States Patent
Roh

(10) Patent No.: US 8,767,889 B2
(45) Date of Patent: Jul. 1, 2014

(54) NORMALIZATION OF SOFT BIT INFORMATION FOR FEC DECODING

(75) Inventor: June Chul Roh, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 160 days.

(21) Appl. No.: 13/591,970

(22) Filed: Aug. 22, 2012

(65) Prior Publication Data

US 2013/0051444 A1 Feb. 28, 2013

(51) Int. Cl.
*H04L 27/06* (2006.01)

(52) U.S. Cl.
USPC .......................................... 375/341

(58) Field of Classification Search
USPC ................. 375/260, 262, 316, 340–341, 346; 714/752, 786, 794
See application file for complete search history.

(56) References Cited

U.S. PATENT DOCUMENTS

| 7,746,951 | B2 | 6/2010 | Hwang et al. | |
|---|---|---|---|---|
| 7,860,194 | B2 | 12/2010 | Kim et al. | |
| 8,102,949 | B2 | 1/2012 | Ling et al. | |
| 2004/0243917 | A1 | 12/2004 | Suh et al. | |
| 2007/0183541 | A1* | 8/2007 | Moorti et al. | 375/341 |
| 2009/0086845 | A1* | 4/2009 | Demirhan et al. | 375/295 |
| 2010/0202572 | A1* | 8/2010 | Bae et al. | 375/341 |
| 2011/0026574 | A1* | 2/2011 | Zhou et al. | 375/227 |
| 2012/0121033 | A1* | 5/2012 | Allpress | 375/285 |

* cited by examiner

*Primary Examiner* — Khanh C Tran
(74) *Attorney, Agent, or Firm* — Steven A. Shaw; Wade James Brady, III; Frederick J. Telecky, Jr.

(57) ABSTRACT

A method of generating normalized bit log-likelihood ratio (LLR) values. A signal is received in a frequency band after transmission over a media, wherein the signal includes at least one complex data symbol having a plurality of information bits, and the complex data symbol is transmitted on at least one frequency channel. Initial LLR values are calculated for each of the plurality of information bits based on bit-to-symbol mapping of modulation and noise variance information from the complex data symbol. An average signal to noise ratio (SNR) of the frequency channel is calculated. Each initial LLR value is normalized by dividing by the average SNR to generate a plurality of normalized LLR values. The normalized LLR values may be quantized to provide a finite-bit representation.

16 Claims, 5 Drawing Sheets

NORMALIZATION OF SOFT BIT INFORMATION FOR FEC DECODING

CROSS REFERENCE TO RELATED APPLICATIONS

This application and the subject matter disclosed herein claims the benefit of Provisional Application Ser. No. 61/526,521 entitled "FINITE-RESOLUTION REPRESENTATION METHOD OF SOFT BIT INFORMATION" filed Aug. 23, 2011, which is herein incorporated by reference in its entirety.

FIELD

Disclosed embodiments relate generally to generating log-likelihood ratio (LLR) values for forward error correction (FEC) decoding in communication systems.

BACKGROUND

Frequency-domain equalization is performed in some communications systems, such as communications systems based on orthogonal frequency domain multiplexing (OFDM) and single-carrier systems with frequency-domain equalization (SC-FDE). An OFDM system transmits multiple data symbols at the same time over a media on a plurality of sub-carriers in a frequency band. The sub-carriers (both pilot and data sub-carriers) with the same time index together make up an OFDM symbol.

A variety of communication systems, including OFDM-based systems, use "soft bit" information (or metric) at the receiver for decoding information. Log-likelihood ratio (LLR) values are commonly used as the soft bit information. For example, in communication systems using convolution coding for FEC, LLR values are calculated for each information bit to be processed, and the LLR values are fed into a decoder, such as a Viterbi decoder, to decode the information bits. Other FEC schemes that require soft bit information include turbo codes and low-density parity-check (LDPC) codes.

FIG. 1 is a block diagram depiction of a conventional wireless OFDM receiver 100 which employs frequency-domain equalization and decoding using LLR values. Receiver 100 receives a RF signal in the form of symbols including a plurality of sub-carriers (tones) via antenna 101 as a sample data stream from the left to the right of the FIG. The analog front end (AFE) block 105 receives the signal from the antenna 101, which may include a variable gain amplifier (VGA), down-converter (or mixer), RF/analog filters and analog-to-digital (A/D) converter.

Cyclic prefix (CP) removal block 108 after the AFE block 105 can be used to remove the doubled (redundant) CP on an OFDM frame preamble structure for the IEEE 802.15.4 g standard having an LTF structure including two LTF symbols. More generally, in OFDM systems (including wireless local area networks (LANs)), CP removal block 108 removes the single CP included in the preamble.

After CP removal by CP removal block 108, the samples are then converted from serial to parallel (1 to N) by serial to parallel (S/P) conversion block 110. The receiver 100 includes a FFT block 115 which performs a Fast Fourier Transform (FFT) on the data from S/P conversion block to generate a plurality of frequency-domain samples, and then feeds the results to the frequency-domain equalization/combination block 120. Frequency-domain equalization/combination block 120 receives channel estimates for the respective sub-carriers from the channel estimation block 125 shown.

Frequency-domain equalization/combination block 120 is operable to compensate the received signal for linear distortion from the channel (e.g., multipath effects). Parallel to serial conversion is performed by parallel to serial (P/S) conversion block 130. LLR calculation block 135 receives (i) channel estimates from channel estimation block 125 and (ii) noise variance estimates from noise variance estimation block 145 which has an input tap coupled to the output of the FFT block 115. LLR calculation block 135 is operable to generate LLR values using (i) and (ii).

LLR calculation block 135 is coupled to the output of P/S conversion block 130, and to the input of forward error correction (FEC) decoding block referred to herein as decoder 140, which using the LLR values from the LLR calculation block 135 recovers bits from the original (transmitted) data stream. In real-world systems, the signal processing modules (all blocks except antenna 101 and AFE block 105) are controlled by software run by a computing device, such as a digital signal processor (DSP) or application specific integrated circuit (ASIC).

Decoders 140 such as the Viterbi decoder are generally able to process soft bit information with a finite-bit resolution (e.g., 4 bits). The LLR values which are theoretically derived by conventional LLR calculation block 135 have a very wide range in value, depending on the operating condition of system. In particular, the LLR value scales in proportion to the SNR (signal-to-noise ratio) of the channel, as well as the channel gain. This makes properly quantizing the soft bit information important to avoid a performance loss in FEC decoding. There is a need for a simple but efficient method that enables finite-bit representation of log-likelihood ratio (LLR) values.

SUMMARY

Disclosed embodiments are directed, in general, to communication systems and, more specifically, to methods of generating normalized log-likelihood ratio (LLR) values for use in decoding for communication systems. Disclosed embodiments normalize theoretical LLR values using an average SNR to confine the range of the resulting normalized LLR values. For OFDM systems, the average SNR is defined over all active sub-carriers over which the symbol is transmitted. Disclosed normalized LLR values increase the concentration around a mean value as the SNR increases, yet still include all the necessary soft bit information. Disclosed normalized LLR values also allow efficient representation of LLR values with finite bits to provide a finite-bit LLR value representation.

BRIEF DESCRIPTION OF THE DRAWINGS

Reference will now be made to the accompanying drawings, which are not necessarily drawn to scale, wherein:

FIGS. 4A and 4B show a statistical distribution of the normalized LLR and the quantized LLR for QPSK modulation with no spreading (spreading factor ($S_F$)=1) in additive white Gaussian noise (AWGN), at an SNR=10 dB, while

DETAILED DESCRIPTION

Figure 1:
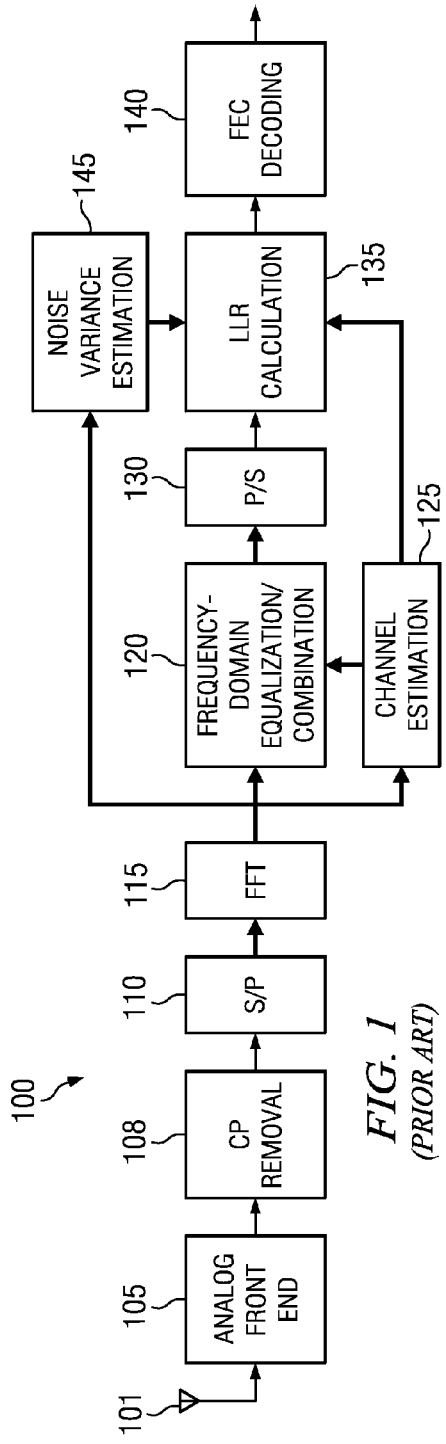
FIG. 1 is a block diagram depiction of a conventional wireless OFDM receiver which employs LLR value calculation for decoding, for which disclosed embodiments can be implemented.

Disclosed embodiments now will be described more fully hereinafter with reference to the accompanying drawings. Such embodiments may, however, be embodied in many different forms and should not be construed as limited to the embodiments set forth herein. Rather, these embodiments are provided so that this disclosure will be thorough and complete, and will fully convey the scope of this disclosure to those having ordinary skill in the art. One having ordinary skill in the art may be able to use the various disclosed embodiments and their equivalents. As used herein, the term "couple" or "couples" is intended to mean either an indirect or direct electrical connection, unless qualified as in "communicably coupled". Thus, if a first device couples to a second device, that connection may be through a direct electrical connection, or through an indirect electrical connection via other devices and connections.

Disclosed embodiments are described with a signal model based on orthogonal frequency division multiplexing (OFDM)-based systems. However, disclosed models are not limited to OFDM systems and are applicable to variety of systems that use soft bit information, including single-carrier communication systems. Disclosed embodiments are applicable to both wireless and wired communication systems.

When frequency-domain spreading is applied during transmission by a transmitter with a spreading factor $S_F$, the same symbol $s_n$ (e.g., using BPSK, QPSK, or QAM modulation) is simultaneously transmitted over $S_F$ sub-carriers, with optional predetermined phase rotations included. The received signal $r_{(k)}$ at the receiver can be represented in a vector notation as follows: for example, with $S_F$=2, $$\begin{bmatrix} r_{(k_1)} \\ r_{(k_2)} \end{bmatrix} = \begin{bmatrix} h_{(k_1)} e^{j\phi_1} \\ h_{(k_2)} e^{j\phi_2} \end{bmatrix} s_n + \begin{bmatrix} w_{(k_1)} \\ w_{(k_2)} \end{bmatrix}, n = 0, \ldots, N_d/S_F - 1 \quad (1)$$

where $r_{(k)}$ is the received signal on a sub-carrier (logical frequency k)

$h_{(k)}$: actual channel frequency response on a sub-carrier (logical frequency k)

$\phi_i$: predetermined phase rotation for the i-th sub-carrier applied at the transmitter $s_n$: transmitted data symbol (e.g., having BPSK, QPSK, QAM modulation)

$w_{(k)}$: noise (and possibly interference together) on a sub-carrier (logical frequency k), and $N_d$ is the number of available data sub-carriers.

With the receiver signal model including the predetermined phase rotations applied at the transmitter, the received signal $r_{(k)}$ can be represented in the following vector notation (the vector form of Equation 1):

$$r_n = h_n s_n + w_n \quad (2)$$

where $$r_n = \begin{bmatrix} r_{(k_1)} \\ r_{(k_2)} \end{bmatrix}, h_n = \begin{bmatrix} h_{(k_1)} e^{j\phi_1} \\ h_{(k_2)} e^{j\phi_2} \end{bmatrix}, w_n = \begin{bmatrix} w_{(k_1)} \\ w_{(k_2)} \end{bmatrix}.$$

In this example, the transmitted date symbol $s_n$ is transmitted over $S_F$=2 sub-carriers, ($k_1$, $k_2$) among the $N_d$ available data sub-carriers. The next transmitted data symbol can be transmitted on a different set of $S_F$=2 sub-carriers.

A combining operation known as maximal ratio combining (MRC) can be implemented by frequency domain equalization/combination block 120 for channel equalization and de-spreading, with the output $y_n$ for the data symbol $s_n$ provided by frequency domain equalization/combination block 120 given by:

$$y_n = \hat{h}_n^H r_n \quad (3)$$

where $(\bullet)^H$ represents the conjugate transpose of a vector, and $\hat{h}_n$ is the vector that contains all the channel frequency response estimates and corresponding phase rotations $\phi_i$:

$$\hat{h}_n = \begin{bmatrix} \hat{h}_{(k_1)} e^{j\phi_1} \\ \hat{h}_{(k_2)} e^{j\phi_2} \end{bmatrix}.$$

The equalization/combining scheme described above is provided only as an example. However, disclosed finite-resolution representation (normalized) LLR can be used with other types of equalization/combining, such as minimum mean square error (MMSE)-type equalization.

A finite-resolution representation method of LLR value calculation is now described for OFDM systems. The resulting finite-bit LLR values can then be processed by a decoder, such as a soft-decision Viterbi decoder. Let $M=2^m$ be the number of constellation points for a given modulation scheme (e.g., BPSK, QPSK, or QAM) constellation, so that m bits are mapped into the in-phase (I) and quadrature (Q)-phase components of a complex symbol. Let $s_n$ denote the complex data symbol to be demodulated, and $\{b_{n,0}, b_{n,1}, \ldots, b_{n,m-1}\}$ be the corresponding bits (in the m bit sequence).

Typically for QPSK or QAM modulation, the bits with lower m/2 indices are mapped to the real value of the constellation point, and the bits with the upper m/2 indices are mapped to the imaginary value of the constellation point. The soft bit metrics have the same sign as provided by a hard slicer and whose absolute value indicates the reliability of the hard slicer decision.

Assuming the channel frequency response estimate provided by channel estimation block 125 is accurate, i.e., $\hat{h}_n = h_n$, the output after equalization provided by frequency-domain equalization/combination block 120 can be expressed as follows:

$$y_n = \|h_n\|^2 s_n + \tilde{w}_n \quad (4)$$

where $\|h_n\|^2 = h_n^H h_n$, for example, $\|h_n\| = |h_{(k_1)}|^2 + |h_{(k_2)}|^2$ when $S_F$=2; $\tilde{w}_n \sim CN(0, \sigma_{\tilde{w}_n}^2)$ [$a \sim CN(m_a, \sigma_a^2)$ represents that the random variable a is statistically distributed following a complex Gaussian distribution with mean $m_a$ and variance $\sigma_a^2$].

$$\sigma_{\tilde{w}_n}^2 = h_n^H \Sigma_{w_n w_n} h_n \quad (5)$$

where $\Sigma_{w_n w_n} = E\{w_n w_n^H\}$ is the auto-covariance matrix for the noise vector $w_n$. In the case of independent noises on the sub-carriers with same variance $\sigma^2$, $$\sigma_{\tilde{w}_n}^2 = \|h_n\|^2 \sigma^2 \quad (6)$$

The soft information referred to herein as the LLR for information bit $b_{n,i}$ is defined as:

$$L(b_{n,i}) = \log \frac{P\{y_n | b_{n,i} = 1\}}{P\{y_n | b_{n,i} = 0\}} \quad (7)$$

where $P\{y_n | b_{n,i}\}$ is the conditional probability density function for a given information bit $b_{n,i}$.

Figure 2:
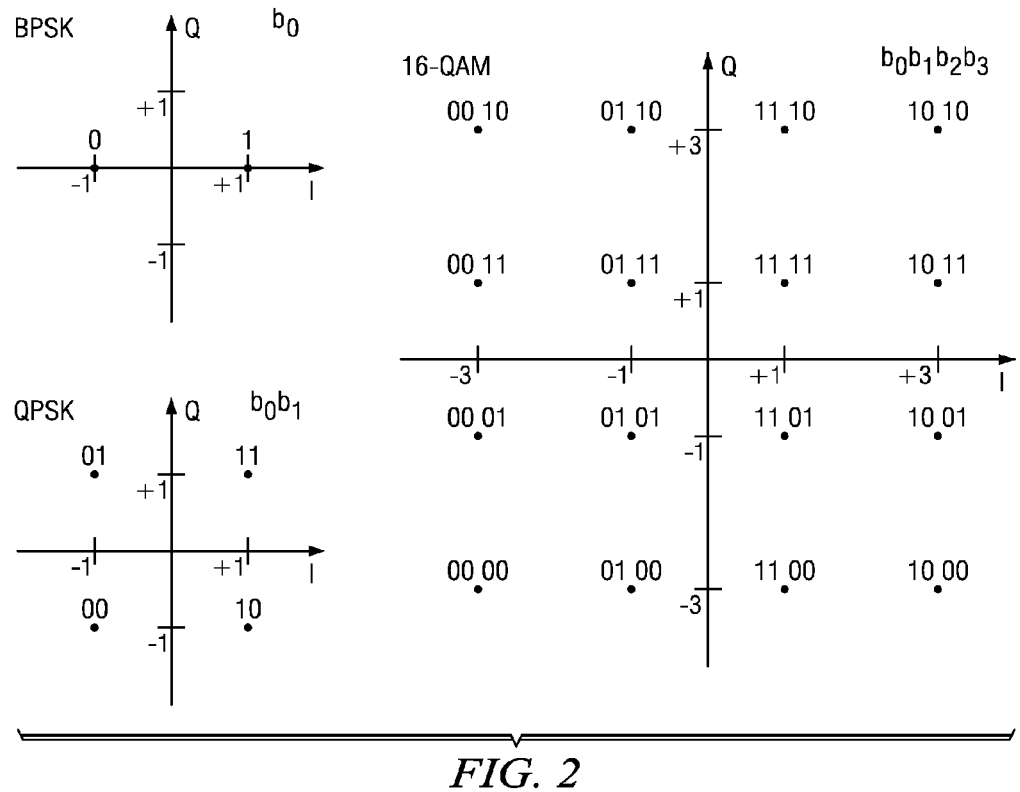
FIG. 2 shows examples of bit-to-symbol mapping for BPSK, QPSK and 16 QAM modulations, where the bit sequence $b_0 b_1 b_2 b_3$ represents four bits.

FIG. 2 shows examples of bit-to-symbol mapping for BPSK, QPSK and 16 QAM modulations, where the bit sequence $b_0 b_1 b_2 b_3$ represents four information bits. A normalization factor $K_{MOD}$ is multiplied to the symbol mapping shown. $K_{MOD}=1$, $1/\sqrt{2}$, and $1/\sqrt{10}$, for BPSK, QPSK, and 16-QAM, respectively, to make $E\{|s_n|^2\}=1$. It is noted that the same bit-to-symbol mapping is applied to I and Q, independently each other. For example, for the 16-QAM constellation, only in-phases (I) samples are used in calculating LLRs for the first 2 bits, and only quadrature (Q) samples for the last 2 bits. The following convention is used herein: $y_{n,R} = \text{Re}\{y_n\}$ and $y_{n,I} = \text{Im}\{y_n\}$, that is, $$y_n = y_{n,R} + j y_{n,I}$$

An example is now provided for QPSK modulation. To generate conventional (theoretical) LLR values, the LLR values for the two information bits (bits 0 and 1) can be derived as follows:

$$L(b_{n,0}) = \log \frac{\exp\left(-\frac{1}{\sigma_{\tilde{w}_n}^2}(y_{n,R} - K_{MOD}\|h_n\|^2)^2\right)}{\exp\left(-\frac{1}{\sigma_{\tilde{w}_n}^2}(y_{n,R} + K_{MOD}\|h_n\|^2)^2\right)} = \frac{4}{\sqrt{2}\,\sigma^2} y_{n,R} \quad (8)$$

where $\sigma_{\tilde{w}_n}^2 = \|h_n\|^2 \sigma^2$ is the variance of $\tilde{w}_n$ (independent noises with uniform variance) and $K_{MOD}=1/\sqrt{2}$. Similarly, $$L(b_{n,1}) = \frac{4}{\sqrt{2}\,\sigma^2} y_{n,I} \quad (9)$$

As can be seen from Equation 8 and 9, conventional theoretically-derived LLR values are scaled in proportion to the SNR of the particular channel (or the SNR of a set of sub-carriers in OFDM with frequency-domain spreading exploited) over which the symbol is transmitted. Disclosed normalized LLR values $\tilde{L}(b_{n,i})$ are obtained by normalizing the theoretically-derived LLR values $L(b_{n,i})$ with the average SNR (or optional scaled version of SNR) computed over all active sub-carriers, as follows:

$$\tilde{L}(b_{n,i}) = \frac{L(b_{n,i})}{\alpha \overline{SNR}}, \ i = 0, 1, \ldots, m-1. \quad (10)$$

where $\alpha$ is a constant for optional scaling that can be included to facilitate the quantization process following normalization described below. For example, $\alpha$ can be selected to make the normalized LLR $\tilde{L}(b_{n,i})$ be statistically distributed centered at $\pm 1$ in BPSK and QPSK. For the signal model in (4), $$\overline{SNR} = E\{\|h_n\|^4 / \sigma_{\tilde{w}_n}^2\} \quad (11)$$

where $E\{\cdot\}$ is an expectation (or statistical average) operation. In the case of independent noises on the sub-carriers with same variance, from (6)

$$\overline{SNR} = E\{\|h_n\|^2 / \sigma^2\} \quad (12)$$

In a practical implementation of an OFDM system, the following expression can be used for computing the average SNR:

$$\overline{SNR} \approx \frac{S_F G_h}{\hat{\sigma}^2} \quad (13)$$

where $\hat{\sigma}^2$ is an estimate for the noise variance $\sigma^2$, and $G_h$ (an average per sub-carrier channel gain) is an estimate for $E\{|h_k|^2\}$ obtained by averaging the channel frequency response estimates $\hat{h}_n$ provided by frequency domain equalization/combination block 120 across all Na active sub-carriers (k), that is, $$G_h = \frac{1}{N_a} \sum_k |\hat{h}_k|^2 \quad (14)$$

where the summation for calculation of $G_h$ is over all $N_a$ sub-carriers. $N_a$ is the sum (total) of the number of pilot sub-carriers $N_p$ and the number of data sub-carriers $N_d$ ($N_a = N_p + N_d$). The estimation of $E\{|h_k|^2\}$ provided by calculation of $G_h$ is generally performed once per frame after channel estimation by frequency-domain equalization block 120, and the same $E\{|h_k|^2\}$ value can be used throughout the receiver's header and PSDU decoding.

The normalized LLR can be defined (with $\alpha=2$) from equation 10 as follows:

$$\tilde{L}(b_{n,i}) = \frac{L(b_{n,i})}{2\overline{SNR}}, \ i = 0, 1. \quad (15)$$

As an example for QPSK modulation, using (equation 15, and equation 13 for $\overline{SNR}$) the normalized LLR values are given by:

$$\tilde{L}(b_{n,0}) = \frac{\sqrt{2}\, y_{n,R}}{S_F G_h} \quad (16)$$

$$\tilde{L}(b_{n,1}) = \frac{\sqrt{2}\, y_{n,I}}{S_F G_h}$$

Figure 3:
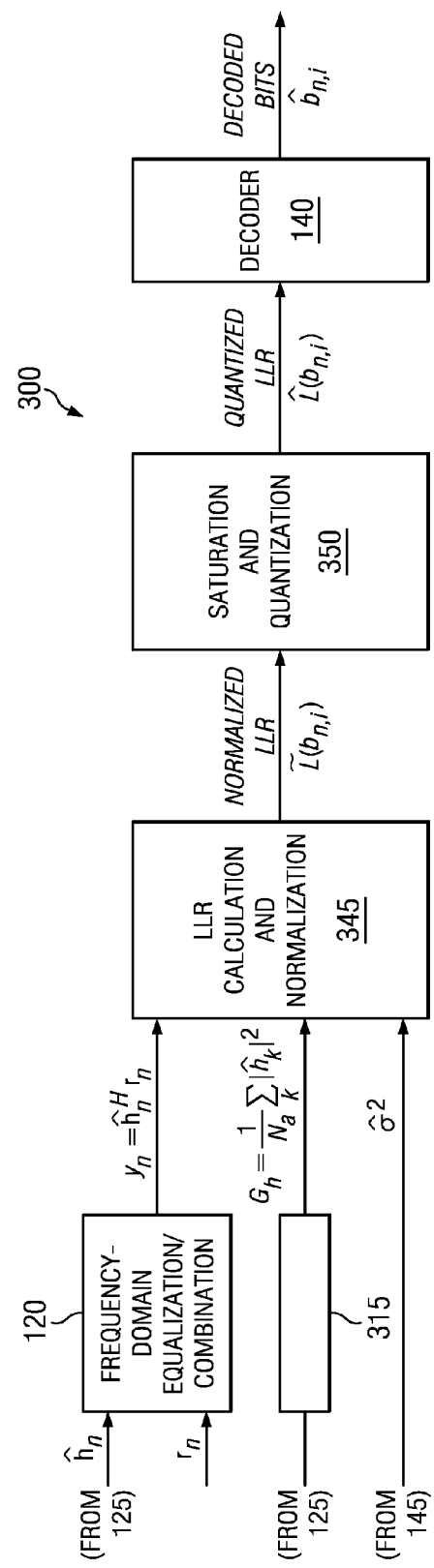
FIG. 3 is an example functional block diagram depiction of a receiver portion configured for generating disclosed normalized LLR values with optional LLR value quantization before decoding, according to an example embodiment.

FIG. 3 is an example functional block diagram depiction of a receiver portion 300 configured for generating disclosed normalized LLR values with optional LLR value quantization before decoding, according to an example embodiment. Receiver portion 300 includes a frequency domain equalization/combination block 120 which performs MRC for channel equalization and de-spreading to generate processed data samples $y_n$ based on the expression in Equation 3, copied again below:

$$y_n = \hat{h}_n^H r_n$$

where as noted above $\hat{h}_n$ is the vector that contains all the channel frequency response estimates and the phase rotations $\phi_i$, and $r_n$ is the received signal in vector notation.

The processed data samples $y_n$, $G_h$ (estimate for $E\{|h_k|^2\}$ provided by the $G_h$ generation block 315 by averaging the channel frequency response estimates; equation 14), and $\hat{\sigma}^2$ (estimate for noise variance from noise variance estimation block 145) are all provided as inputs to LLR calculation and normalization block 345. LLR calculation and normalization block 345 (using equation 10) generates the normalized LLR values $\tilde{L}(b_{n,i})$. Although the $G_h$ calculation is shown in FIG. 3 provided by $G_h$ generation block 315, in other embodiments channel equalization/combination block 120 or LLR calculation and normalization block 345, can provide the $G_h$ calculation.

Although not shown in FIG. 3, P/S 130 shown in FIG. 1 would be positioned between the channel equalization/combination" block 120 and LLR calculation and normalization block 345.

The output of LLR calculation and normalization block 345 is shown coupled to saturation & quantization block 350. Saturation and quantization block 350 provides quantized LLR values as described above. A variety of quantization methods can be used. For example, when the saturation and quantization block 350 has a quantization code book, C={$\hat{c}_1$, $\hat{c}_2$, . . . , $\hat{c}_N$}, the quantized LLR values can defined using the codes as:

$$\hat{L}(b_{n,i}) = \arg \min_{\hat{c} \in C} |\tilde{L}(b_{n,i}) - \hat{c}|^2 \qquad (17)$$

The normalized LLR values after quantization by saturation and quantization block 350 are provided to decoder 140 for decoding the information data to decode the received signal.

Using an appropriate constant for optional scaling (α value in equation 10) the normalized LLR values generated by LLR calculation and normalization block 345 may be scaled so that they are distributed around ±1 in an AWGN channel (see FIGS. 4A and 5A described below). Scaling facilitates the normalized LLR values to be quantized using a known quantizer to provide a finite-bit representation.

Figure 4A:
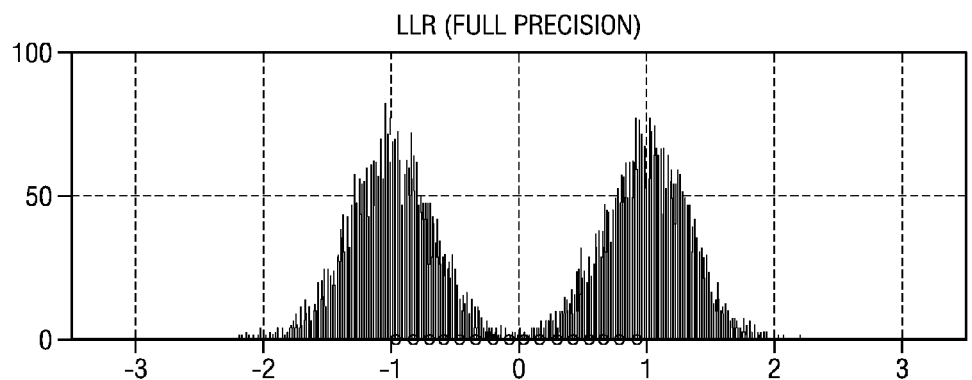
Figure 4B:
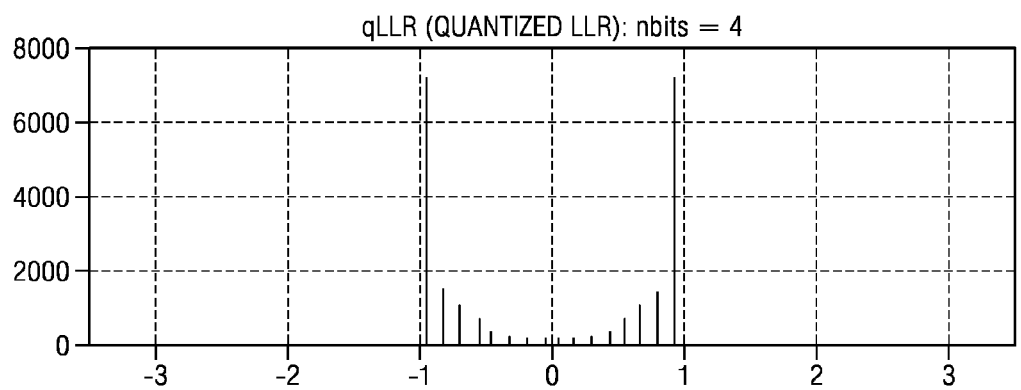
Figure 5A:
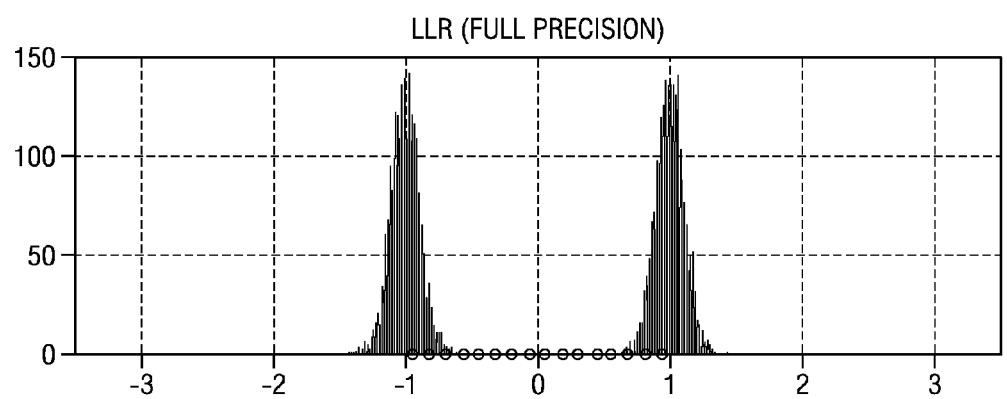
FIGS. 5A and 5B shows the same at a SNR=20 dB.
Figure 5B:
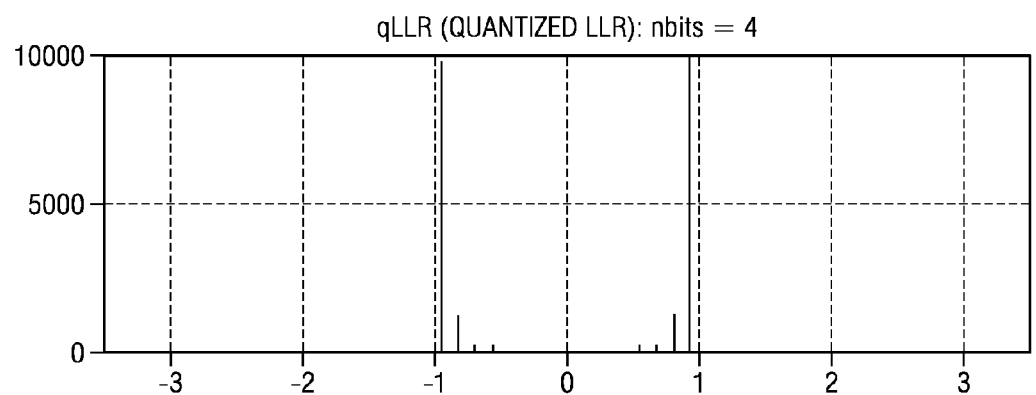

FIGS. 4A and 4B show a statistical distribution of the normalized LLR and the quantized LLR for QPSK modulation with no spreading ($S_F$=1) in AWGN for a 4-bit LLR, at an SNR=10 dB, while FIG. 5A, 5B shows the same at a SNR=20 dB. Four (4) LLR bits are for fractional precision obtained by carrying the reliability information of the detected bit. The x-axis provides the LLR values and the y-axis provides the occurrence of the x-axis values (basically histograms). An optional scaling factor of 2 was used (α=2). In FIGS. 4A and 5A, the 16 circles shown represent the quantization values employed for the quantization performed to generate the quantized LLR distribution shown in FIGS. 4B and 5B, respectively. Since the respective LLR values are normalized by the average SNR, the range of resulting normalized LLR values can be seen to be more confined (concentrated) in the dB case (FIG. 5A) as compared to the 10 dB case (FIG. 4A). Comparing FIGS. 4B and 5B, after quantization processing, the LLR values are mapped more frequently to the "most reliable 0" (the quantization level nearest to '−1') or "most reliable 1" (the quantization level nearest to '+1') as the SNR increases. This is a desired feature which improves performance of the decoder.

Figures 6, 7A:
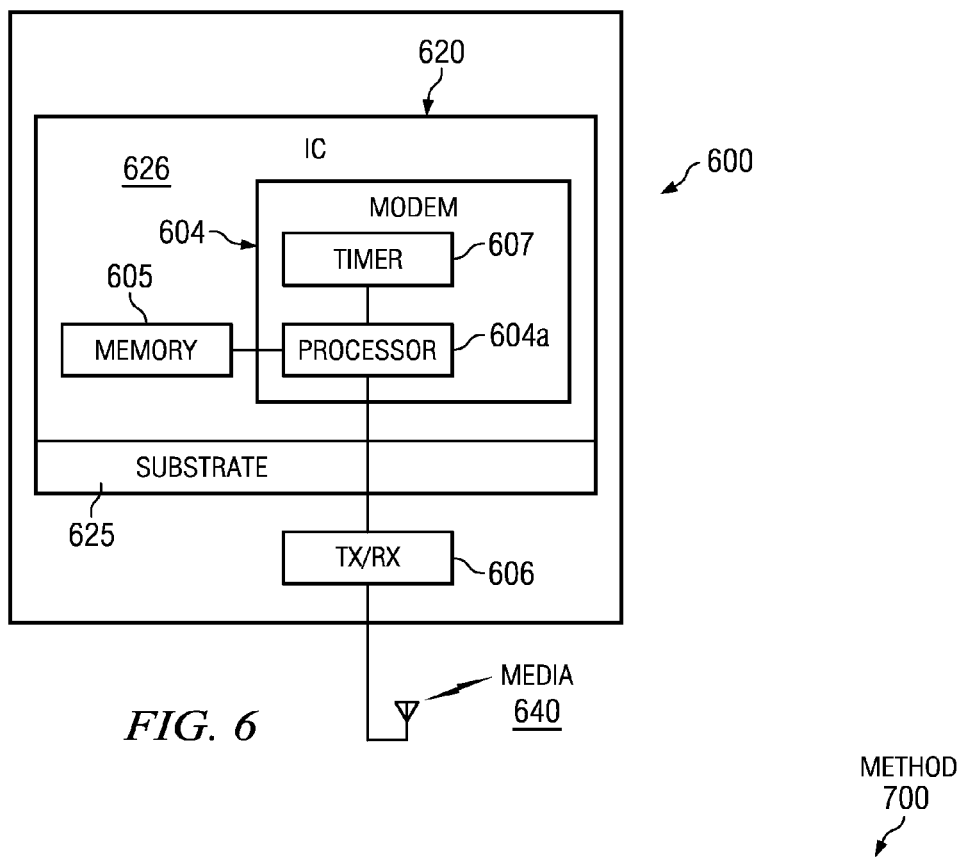
FIG. 6 is a block diagram schematic of a communication device having a disclosed modem that implements calculating normalized LLR values using a disclosed algorithm, according to an example embodiment.
FIG. 7A is a flowchart for an example method of generating normalized LLR values which is generic to include both single carrier and OFDM, according to an example embodiment.

FIG. 6 is a block diagram schematic of a communication device 600 having a disclosed modem 604 that implements a disclosed normalized LLR value calculation algorithm when operating as a receiver, according to an example embodiment. In one particular embodiment, communications device 600 can be used in a smart utility networks (SUN) based on IEEE 802.15.4 g, at a service node (which includes switch nodes and terminal nodes) or a base (data concentrator) node in the network. In another embodiment, communications device 600 is used in a wired network, such as a powerline communication (PLC) network.

Modem 604 includes a processor (e.g., a digital signal processor, (DSP)) 604a coupled to an associated memory 605 that that stores a disclosed normalized LLR value calculation algorithm which provides code for the algorithm. Memory 605 comprises non-transitory machine readable storage, for example, static random-access memory (SRAM). In operation, the processor 604a is programmed to implement a disclosed channel estimation algorithm. Modem 604 includes a timer 607, such as for ACK transmission, Carrier Sense Multiple Access/collision avoidance (CSMA)/CA) back-off and data transmission purposes in SUNs or PLC networks.

The transceiver (TX/RX) 606 is communicably coupled to the modem 604 for coupling of the communications device 600 to the transmission media 640. The modem 604 is shown formed on an integrated circuit (IC) 620 comprising a substrate 625 having a semiconductor surface 626, such as a silicon surface. Memory 605 may be included on the IC 620. In another embodiment the modem 604 is implemented using 2 processor chips, such as 2 DSP chips. Besides the DSP noted above, the processor 604a can comprise a desktop computer, laptop computer, cellular phone, smart phone, or an application specific integrated circuit (ASIC).

FIG. 7A is a flowchart for an example method 700 of generating normalized LLR values which is generic to include both single carrier and OFDM. Step 701 comprises receiving a signal in a frequency band after transmission over a media, wherein the signal includes at least one complex data symbol having a plurality of information bits, and the complex data symbol is transmitted on at least one frequency channel. Step 702 comprises calculating initial LLR values for each of the plurality of information bits based on a bit-to-symbol mapping of modulation (e.g., BPSK, QPSK, QAM) and noise variance information from the complex data symbol.

Step 703 comprises calculating an average SNR of the frequency channel, which in the case the signal is a single-carrier modulation signal, is a particular frequency channel. In the single-carrier embodiment, the calculation of average SNR can comprise averaging SNR values for previously received complex data symbols received on the frequency channel, such as for two or more of the most recent complex data symbols received. Step 704 comprises normalizing each initial LLR value by dividing by the average SNR to generate a plurality of normalized LLR values. Step 705 comprises quantizing the normalized LLR values to provide a finite-bit representation.

Figure 7B:
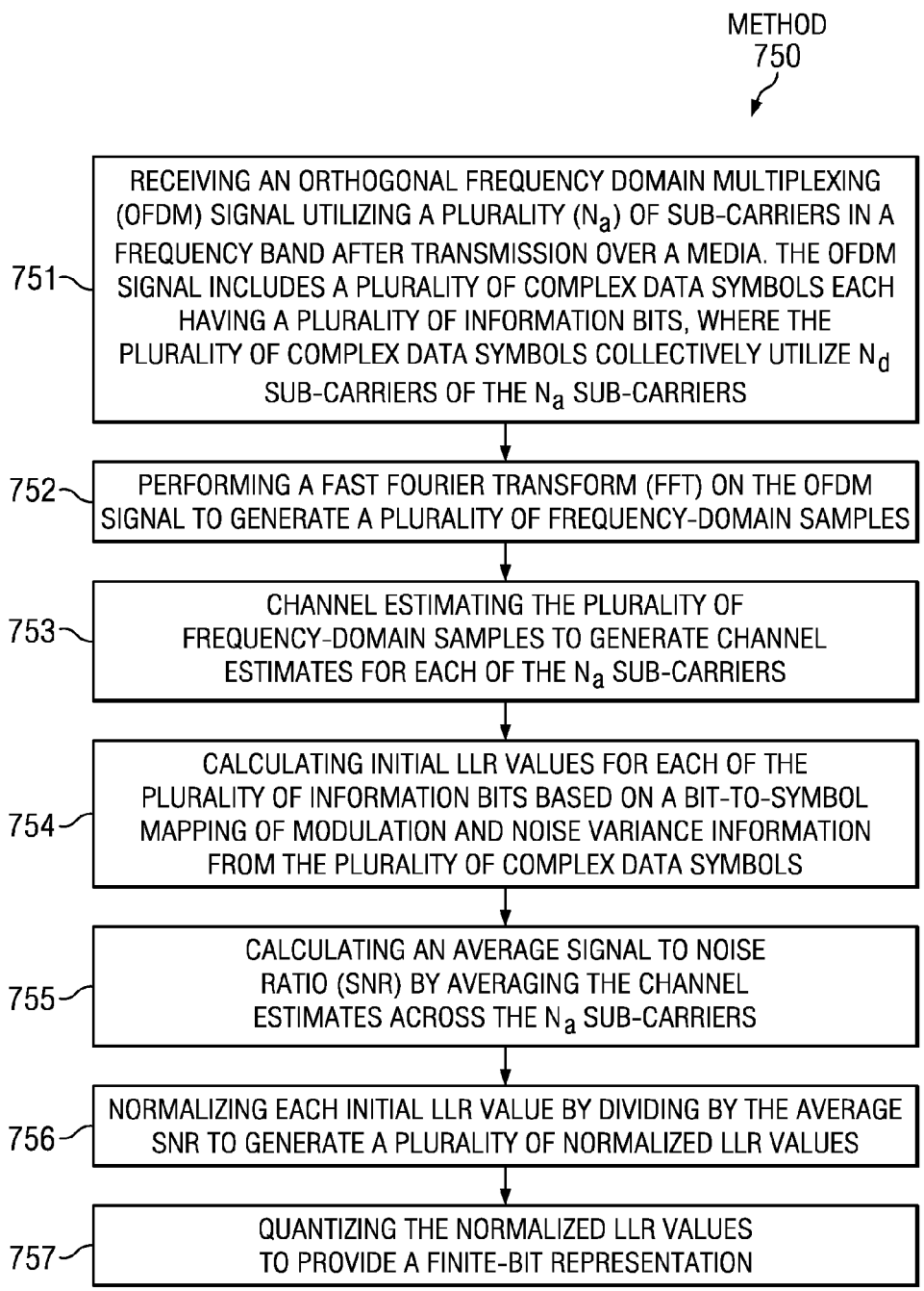
FIG. 7B is a flowchart for an example method of generating normalized LLR values for OFDM systems.

FIG. 7B is a flowchart for an example method 750 of generating normalized LLR values for OFDM systems. Step 751 comprises receiving an OFDM signal utilizing a plurality ($N_a$) of sub-carriers in a frequency band after transmission over a media. The OFDM signal includes a plurality of complex data symbols each having a plurality of information bits, where the plurality of complex data symbols collectively utilize $N_d$ sub-carriers of the Na sub-carriers. Step 752 comprises performing a FFT on the OFDM signal to generate a plurality of frequency-domain samples. Step 753 comprises channel estimating the plurality of frequency-domain samples to generate channel estimates for each of the $N_a$ sub-carriers.

Step 754 comprises calculating initial LLR values for each of the plurality of information bits based on a bit-to-symbol mapping of modulation (e.g., BPSK, QPSK, QAM) and noise variance information from the plurality of complex data symbols. Step 755 comprises calculating an average SNR by averaging the channel estimates across the Na sub-carriers. Step 756 comprises normalizing each of the initial LLR values by dividing by the average SNR to generate a plurality of normalized LLR values. Step 757 comprises quantizing the normalized LLR values to provide a finite-bit representation.

Disclosed embodiments are applicable to communication systems based on frequency-domain equalization, including both wireless and wire-based systems, and single carrier and OFDM systems. OFDM is used in digital subscriber line (DSL) standards, and wireless LAN standards such as the American IEEE. 802.11™ (WiFi) and its European equivalent HIPRLAN/2. OFDM has also been proposed for wireless broadband access standards such as IEEE 802.16 (WiMAX) and as the core technique for the fourth-generation (4G) wireless mobile communications. In PLC, OFDM is used in standards such as the IEEE 802.15.4 g SUN [Physical layer specifications for low data rate wireless smart metering utility networks, P802.15.4 g/D4, April, 2011].

Many modifications and other embodiments of the invention will come to mind to one skilled in the art to which this Disclosure pertains having the benefit of the teachings presented in the foregoing descriptions, and the associated drawings. Therefore, it is to be understood that embodiments of the invention are not to be limited to the specific embodiments disclosed. Although specific terms are employed herein, they are used in a generic and descriptive sense only and not for purposes of limitation.

I claim:

1. A method of calculating bit log-likelihood ratio (LLR) values, comprising:
   receiving a signal in a frequency band after transmission over a media, said signal including at least one complex data symbol having a plurality of information bits, wherein said complex data symbol is transmitted on at least one frequency channel;
   calculating initial LLR values for each of said plurality of information bits based on a bit-to-symbol mapping of modulation and noise variance information from said complex data symbol;
   calculating an average signal to noise ratio (SNR) of said frequency channel, and
   normalizing each of said initial LLR values by dividing by said average SNR to generate a plurality of normalized LLR values.

2. The method of claim 1, further comprising quantizing each of said plurality of normalized LLR values to provide finite-bit representations.

3. The method of claim 1, wherein said signal is a single-carrier modulation signal, and wherein said calculating said average SNR comprises averaging SNR values for previously received complex data symbols received on said frequency channel.

4. The method of claim 1, wherein said signal is an orthogonal frequency domain multiplexing (OFDM) signal utilizing a plurality (Na) of sub-carriers in said frequency band, said OFDM signal including a plurality of said complex data symbols each having said plurality of information bits, said plurality of complex data symbols collectively utilizing Nd sub-carriers of said Na sub-carriers, said initial LLR values being based on said bit-to-symbol mapping of modulation and said noise variance information from said plurality of complex data symbols, said method further comprising:
   performing a fast Fourier transform (FFT) on said OFDM signal to generate a plurality of frequency-domain samples, and
   channel estimating said plurality of frequency-domain samples to generate channel estimates for each of said Na sub-carriers;
   wherein said calculating said average SNR comprises averaging said channel estimates across said Na sub-carriers.

5. A method of calculating bit log-likelihood ratio (LLR) values, comprising:
   receiving a orthogonal frequency domain multiplexing (OFDM) signal utilizing a plurality (Na) of sub-carriers in a frequency band after transmission over a media, said OFDM signal including a plurality of complex data symbols each having a plurality of information bits, said plurality of complex data symbols collectively utilizing Nd sub-carriers of said Na sub-carriers;
   performing a fast Fourier transform (FFT) on said OFDM signal to generate a plurality of frequency-domain samples;
   channel estimating said plurality of frequency-domain samples to generate channel estimates for each of said Na sub-carriers;
   calculating initial LLR values for each of said plurality of information bits based on a bit-to-symbol mapping of modulation and noise variance information from said plurality of complex data symbols;
   calculating an average signal to noise ratio (SNR) by averaging said channel estimates across said Na sub-carriers, and
   normalizing each of said initial LLR values by dividing by said average SNR to generate a plurality of normalized LLR values.

6. The method of claim 5, further comprising quantizing each of said plurality of normalized LLR values to provide finite-bit representations.

7. The method of claim 6, further comprising decoding said OFDM signal using said finite-bit representation.

8. The method of claim 5, wherein said normalizing includes scaling and is implemented by the following relation:

$$\tilde{L}(b_{n,i}) = \frac{L(b_{n,i})}{\alpha \overline{SNR}}, i = 0, 1, \ldots, m-1$$

wherein said plurality of normalized LLR values are represented as $\tilde{L}(b_{n,i})$, said initial LLR values are represented by $L(b_{n,i})$, said average SNR is represented by $\overline{SNR}$, m is a number of said plurality of information bits per each of said plurality of complex data symbols, and α is a constant for said scaling.

9. The method of claim 8, wherein said $\overline{SNR}$ is implemented by the following relation:

$$\overline{SNR} \approx \frac{S_F G_h}{\hat{\sigma}^2}$$

where $\hat{\sigma}^2$ is an estimate for a noise variance $\sigma^2$, $S_F$ is a number of said Na sub-carriers over which each of said plurality of complex data symbols is transmitted and wherein said $G_h$ is implemented by the following relation:

$$G_h = \frac{1}{N_a}\sum_k |\hat{h}_k|^2$$

wherein k represents ones of said Na sub-carriers and $\hat{h}_{(k)}$ are said channel estimates.

10. A receiver, comprising:
an analog front end (AFE) coupled to an antenna for receiving a signal in a frequency band after transmission over a media; said signal including at least one complex data symbol having a plurality of information bits, wherein said complex data symbol is transmitted on at least one frequency channel;
a memory which stores a normalized LLR value calculation algorithm including code for said normalized LLR value calculation algorithm,
a modem coupled to said memory and said AFE, said modem including a processor programmed to implement said normalized LLR value calculation algorithm, said processor programmed to implement:
calculating initial LLR values for each of said plurality of information bits based on a bit-to-symbol mapping of modulation and noise variance information from said complex data symbol;
calculating an average signal to noise ratio (SNR) of said frequency channel, and
normalizing each of said initial LLR values by dividing by said average SNR to generate a plurality of normalized LLR values.

11. The receiver of claim 10, wherein said normalized LLR value calculation algorithm includes code for said processor to implement quantizing each of said plurality of normalized LLR values to provide finite-bit representations.

12. The receiver of claim 10, wherein said signal is a single-carrier modulation signal, and wherein said calculating said average SNR comprises averaging SNR values for previously received complex data symbols received on said frequency channel.

13. The receiver of claim 10, wherein said signal is an orthogonal frequency domain multiplexing (OFDM) signal utilizing a plurality (Na) of sub-carriers in said frequency band, said OFDM signal including a plurality of said complex data symbols each having said plurality of information bits, said plurality of complex data symbols collectively utilizing Nd sub-carriers of said Na sub-carriers, said initial LLR values being based on said bit-to-symbol mapping of modulation and said noise variance information from said plurality of complex data symbols, said processor further implementing:
performing a fast Fourier transform (FFT) on said OFDM signal to generate a plurality of frequency-domain samples, and
channel estimating said plurality of frequency-domain samples to generate channel estimates for each of said Na sub-carriers;
wherein said calculating said average SNR comprises averaging said channel estimates across said Na sub-carriers.

14. The receiver of claim 13, wherein said normalizing includes scaling and is implemented by the following relation:

$$\tilde{L}(b_{n,i}) = \frac{L(b_{n,i})}{\alpha\overline{SNR}}, i = 0, 1, \ldots, m-1$$

wherein said plurality of normalized LLR values are represented as $\tilde{L}(b_{n,i})$, said initial LLR values are represented by $L(b_{n,i})$, said average SNR is represented by $\overline{SNR}$, m is a number of said plurality of information bits per each of said plurality of complex data symbols, and α is a constant for said scaling.

15. The receiver of claim 14, wherein said $\overline{SNR}$ is implemented by the following relation:

$$\overline{SNR} \approx \frac{S_F G_h}{\hat{\sigma}^2}$$

where $\hat{\sigma}^2$ is an estimate for a noise variance $\sigma^2$, $S_F$ is a number of said Na sub-carriers over which each of said plurality of complex data symbols is transmitted and wherein said $G_h$ is implemented by the following relation:

$$G_h = \frac{1}{N_a}\sum_k |\hat{h}_k|^2$$

wherein k represents ones of said Na sub-carriers and $\hat{h}_{(k)}$ are said channel estimates.

16. The receiver of claim 10, wherein said modem is formed on an integrated circuit (IC) comprising a substrate having a semiconductor surface, wherein said processor comprises a digital signal processor (DSP).

* * * * *